United States Patent
Neuhäußer et al.

(10) Patent No.: US 11,586,935 B2
(45) Date of Patent: Feb. 21, 2023

(54) SYSTEMS AND METHODS TO SEMANTICALLY COMPARE PRODUCT CONFIGURATION MODELS

(71) Applicant: Siemens Industry Software Inc., Plano, TX (US)

(72) Inventors: Martin Richard Neuhäußer, Nuremberg (DE); Gabor Schulz, Fürth (DE)

(73) Assignee: Siemens Industry Software Inc., Plano, TX (US)

( * ) Notice: Subject to any disclaimer, the term of this patent is extended or adjusted under 35 U.S.C. 154(b) by 896 days.

(21) Appl. No.: 16/469,055

(22) PCT Filed: Apr. 11, 2017

(86) PCT No.: PCT/US2017/026897
§ 371 (c)(1),
(2) Date: Jun. 12, 2019

(87) PCT Pub. No.: WO2018/190799
PCT Pub. Date: Oct. 18, 2018

(65) Prior Publication Data
US 2020/0074309 A1 Mar. 5, 2020

(51) Int. Cl.
*G06N 5/00* (2006.01)
*G06F 30/00* (2020.01)
(Continued)

(52) U.S. Cl.
CPC ............. *G06N 5/006* (2013.01); *G06F 17/16* (2013.01); *G06F 30/00* (2020.01); *G06N 5/04* (2013.01)

(58) Field of Classification Search
CPC .......... G06N 5/006; G06F 17/16; G06F 30/00
See application file for complete search history.

(56) References Cited

U.S. PATENT DOCUMENTS 7,853,906 B2 * 12/2010 Ganai ................. G06F 30/3323
717/124
8,005,661 B2 * 8/2011 Ganai ................. G06F 30/3323
703/2

(Continued)

FOREIGN PATENT DOCUMENTS

CA 2716464 A1 * 6/2011 ............... G06F 7/38
JP 5561135 B2 * 7/2014
(Continued)

OTHER PUBLICATIONS

PCT Search Report dated Dec. 19, 2017, for PCT Application No. PCT/US2017/026897, 11 pages.

*Primary Examiner* — Naum Levin

(57) ABSTRACT

Systems and methods to semantically compare product configuration models. A method includes receiving a first configuration model and a second configuration model. The method includes generating a first order logic (FOL) representation of the first configuration model and an FOL representation of the second configuration model. The method includes performing a satisfiability modulo theories (SMT) solve for nonequivalence satisfiability on the FOL representation of the first configuration model and the FOL representation of the second configuration model. The method includes storing an indication that the first configuration model is equivalent to the second configuration model when the SMT solve for nonequivalence satisfiability is not satisfied.

18 Claims, 3 Drawing Sheets

(51) Int. Cl.
*G06F 17/16* (2006.01)
*G06N 5/04* (2023.01)

(56) References Cited

U.S. PATENT DOCUMENTS

| | | | | |
|---|---|---|---|---|
| 8,359,578 | B2 * | 1/2013 | Wang | G06F 11/3636 |
| | | | | 717/126 |
| 8,413,119 | B2 * | 4/2013 | Langworthy | G06F 8/437 |
| | | | | 717/126 |
| 8,533,142 | B2 | 9/2013 | Collier et al. | |
| 8,589,126 | B2 * | 11/2013 | Ganai | G06F 11/3608 |
| | | | | 703/2 |
| 8,601,414 | B2 * | 12/2013 | Andraus | G06F 30/3323 |
| | | | | 703/2 |
| 8,645,439 | B2 * | 2/2014 | Kinsman | G06F 7/38 |
| | | | | 708/204 |
| 8,707,273 | B2 * | 4/2014 | Imai | G06F 8/313 |
| | | | | 717/114 |
| 8,725,902 | B2 * | 5/2014 | Narain | H04L 41/0813 |
| | | | | 370/338 |
| 9,792,161 | B2 * | 10/2017 | Huang | G06F 9/524 |
| 10,296,330 | B2 * | 5/2019 | Bucuvalas | G06F 8/36 |
| 10,424,019 | B2 * | 9/2019 | Ignatovich | G06F 30/20 |
| 10,528,868 | B2 * | 1/2020 | Gillespie | G06N 5/003 |
| 10,955,804 | B2 * | 3/2021 | Neuhäusser | G05B 19/0428 |
| 11,055,448 | B2 * | 7/2021 | Neuhäßer | G06Q 10/06 |
| 2010/0281469 | A1 * | 11/2010 | Wang | G06F 11/3612 |
| | | | | 717/131 |

FOREIGN PATENT DOCUMENTS

| | | | | |
|---|---|---|---|---|
| WO | WO-2016129073 | A1 * | 8/2016 | G06F 11/36 |
| WO | WO-2016130551 | A1 * | 8/2016 | G06F 8/36 |

* cited by examiner

SYSTEMS AND METHODS TO SEMANTICALLY COMPARE PRODUCT CONFIGURATION MODELS

RELATED APPLICATION

This patent document claims priority under 35 U.S.C. § 119 and all other benefits from PCT Application No. PCT/US2017/026897, filed Apr. 11, 2017, the content of which is hereby incorporated by reference to the extent permitted by law.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. The complexities of models managed by PDM systems makes comparison of different configuration models ineffective or impossible to perform manually and difficult to perform automatically. Improved systems are desirable.

SUMMARY OF THE DISCLOSURE

Various disclosed embodiments include systems and methods to semantically compare product configuration models. A method includes receiving a first configuration model and a second configuration model. The method includes generating a first order logic (FOL) representation of the first configuration model and an FOL representation of the second configuration model. The method includes performing a satisfiability modulo theories (SMT) solve for nonequivalence satisfiability on the FOL representation of the first configuration model and the FOL representation of the second configuration model. The method includes storing an indication that the first configuration model is equivalent to the second configuration model when the SMT solve for nonequivalence satisfiability is not satisfied or that it is equivalent if the SMT solve is not satisfied.

Various embodiments include, when the SMT solve for equivalence is satisfied, showing an indication that the first configuration model is not equivalent to the second configuration model. Various embodiments include, when the SMT solve for equivalence is satisfied, performing an SMT solve for variants in the first configuration model that are not present in the second configuration model, and showing one variant identified by the SMT solve for a variant in the first configuration that is not present in the second configuration model. According to various embodiments, $\vec{v}=(v_1, v_2, \ldots, v_n)$ is used to denote a vector of configuration options that uniquely determine the first problematic configuration. According to various embodiments, $\varphi$ represents the FOL representation of the first configuration model, $\psi$ represents the FOL representation of a corresponding second configuration model, and performing a satisfiability modulo theories (SMT) solve for equivalence comprises searching for a satisfying assignment for $\neg(\varphi \rightarrow \psi)$. According to various embodiments, performing an SMT solve for variants comprises checking the satisfiability of $\varphi \wedge \neg \psi$.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
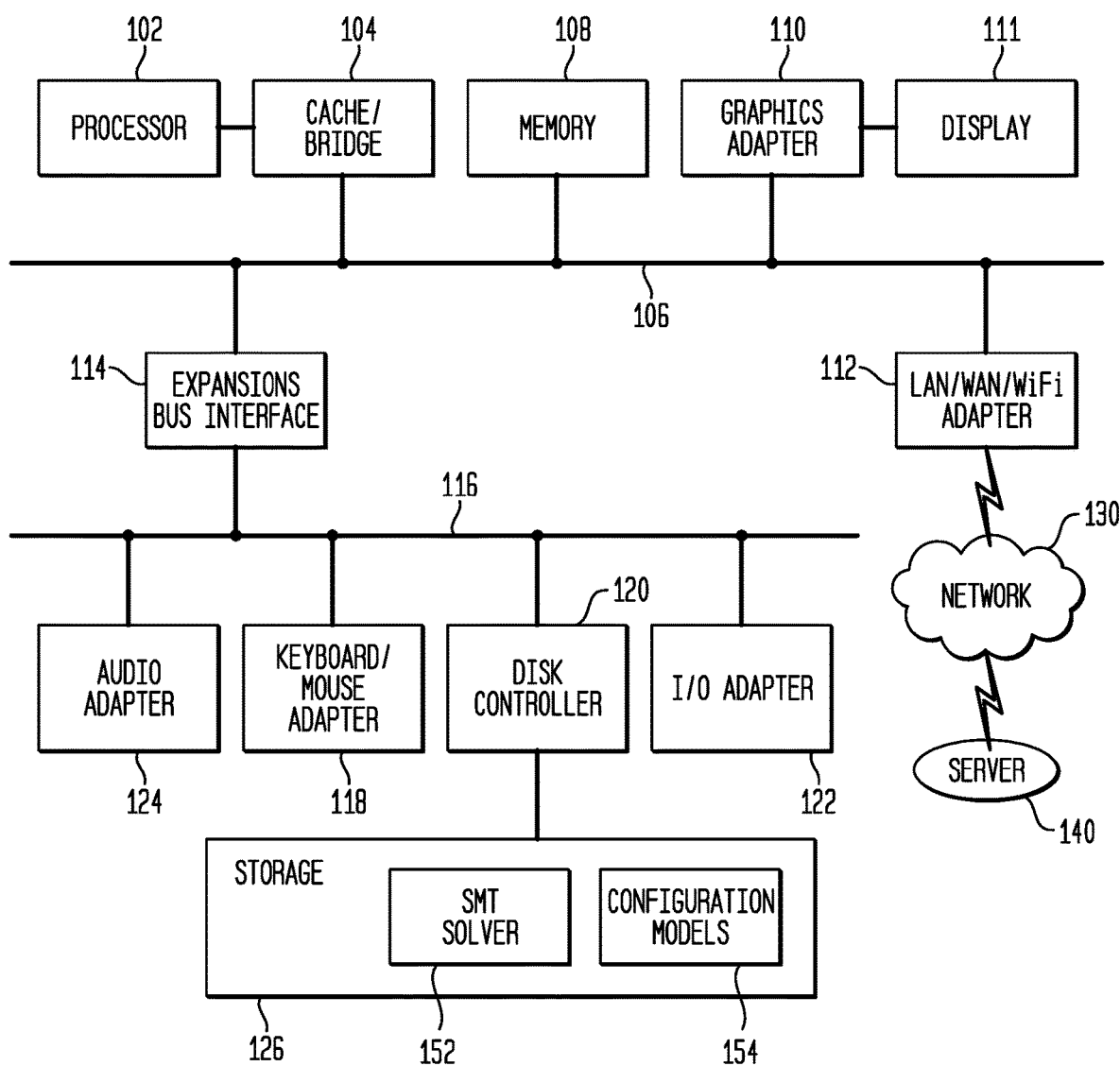
FIG. 1 illustrates a block diagram of a data processing system in which an embodiment can be implemented.
Figure 2:
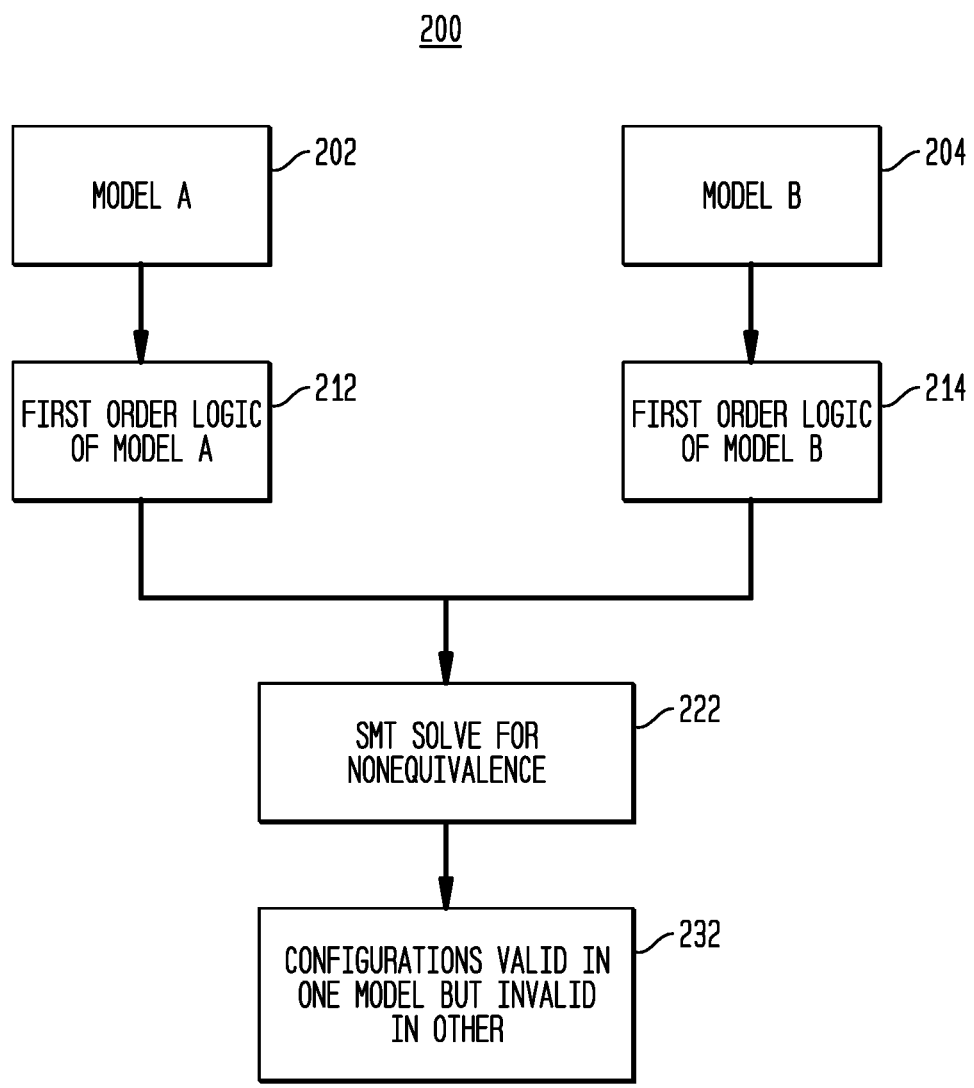
FIG. 2 illustrates logical elements of various embodiments described herein.
Figure 3:
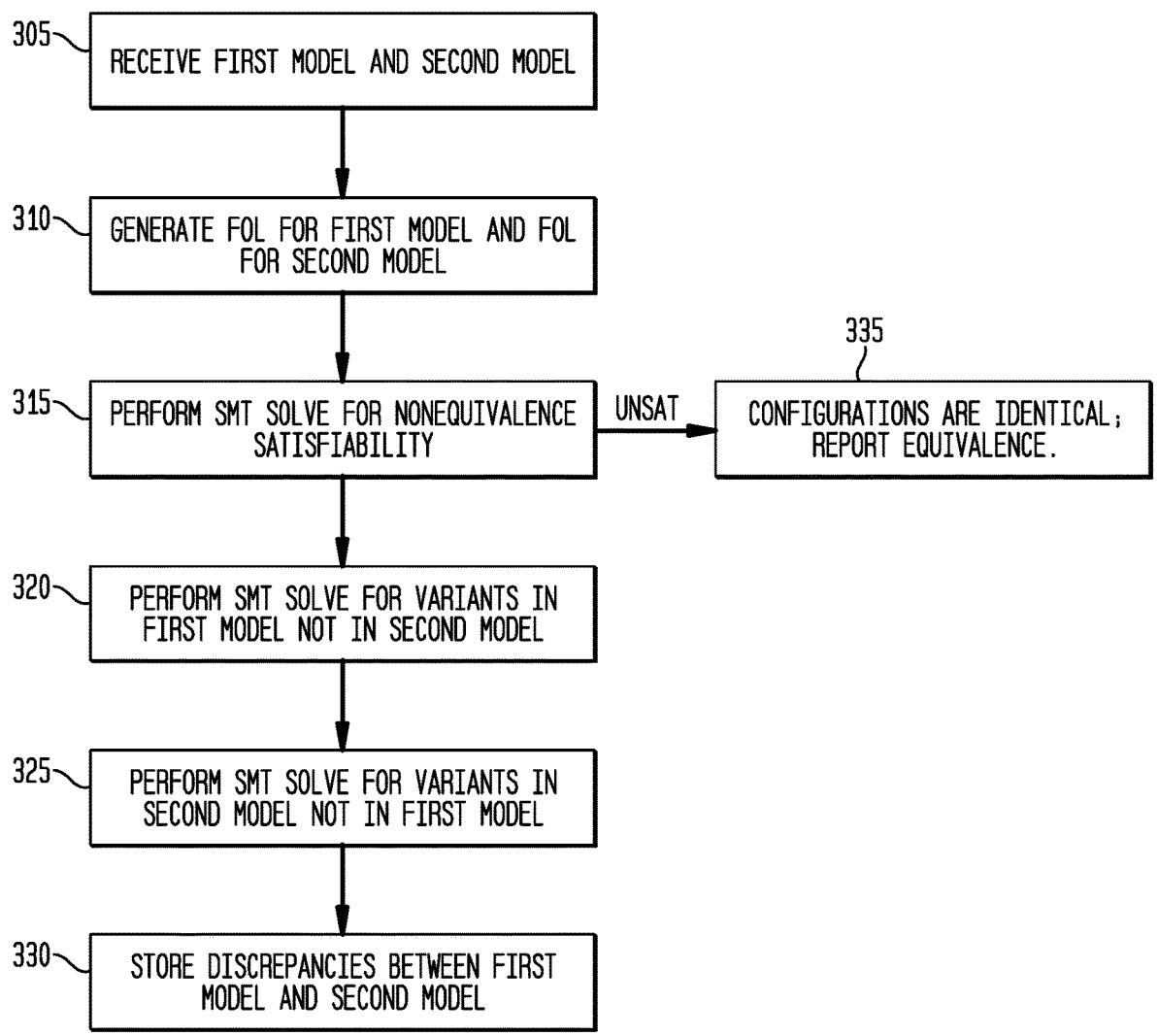
FIG. 3 illustrates a flowchart of a process in accordance with disclosed embodiments.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

During configuration of a complex product such as a car, a drive, or a server computer, one must take into account a large number of constraints such as compatibility requirements between the product's components, marketing aspects, and also physical characteristics of the components. For example, heat emitted by a component of the product may require a different placement of neighboring components; electromagnetic interference may prohibit placing two components next to each other, etc. For a complex product, the set of such constraints quickly becomes too complex to be validated manually. Therefore, configuration models have been introduced that allow to model such dependencies formally. One such product is the Teamcenter® software product, and related products, by Siemens Product Lifecycle Management Software Inc. (Plano, Tex., USA). With such a model at hand, checking that a proposed configuration can actually produce a correctly assembled product can be done automatically by, e.g., theorem provers, logic programming languages, satisfiability modulo theories (SMT), or Boolean satisfiability problem (SAT) solving.

In today's practice, the configuration models themselves become increasingly complex and capture a substantial amount of engineering IP. Consequently, many people work on authoring a configuration model; moreover, whenever a new version of the underlying configuration software is released, the existing configuration model must be ported to the current version.

Hence, working with configuration models naturally leads to model divergence, such that multiple versions of the model exist that may or may not be equivalent. For example, two users may have edited the model simultaneously, leading to divergence. As another example, after an update of the underlying configuration program, the user may wish to verify that the original model and the one obtained after the update procedure are equivalent.

Such a comparison cannot be done manually due to the complexity and the level of abstraction found in such configuration models.

Disclosed embodiments include systems and methods for automatically verifying the equivalence of two configuration models using SMT processes.

FIG. 1 illustrates a block diagram of a data processing system in which an embodiment can be implemented, for example as a PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Storage 126 can store such data as program code for an SMT solver 152, the configuration models 154, and other code, data, and other electronic information as described herein.

SMT solvers are known to those of skill in the art, and use first-order logic (FOL) expressions to form propositional logic statements that can be processed by the SMT solver.

According to disclosed embodiments, the constraints and the structure of the configuration models to compare (model A and model B) are formalized by two sets of FOL formulas. The specific examples used below are non-limiting; those of skill in the art will recognized that equivalent expressions or different notation can be used to represent the same operations.

FIG. 2 illustrates logical elements of various embodiments described herein. This figure shows a first model, model A 202, and a second model, model B 204.

The conjunction of constraints that stem from model A is represented as by $\varphi$, and the conjunction of constraints that stem from model B is represented as $\psi$. The system can construct the formulas $\varphi$ and $\psi$ such that any model of $\varphi$ represents model A, and any model of $\psi$ represents model B, represented in FOL.

These are illustrated in FIG. 2 as FOL 212 of a model A 202 and FOL 214 of model B 204.

The system uses $\vec{v}=(v_1, v_2, \ldots, v_n)$ to denote the vector of configuration options that uniquely determine a configuration.

Then Valid_products $(\varphi)=\{\vec{v} \mid \vec{v} \in \varphi\}$ and Valid_products $(\psi)=\{\vec{v} \mid \vec{v} \in \psi\}$ denote the sets of valid products that are symbolically encoded by $\varphi$ and $\psi$.

This formulation allows a completely symbolic treatment of the divergence problem and the system can automatically construct the formulas $\varphi$ and $\psi$.

The system can then analyze several aspects of divergence between the sets.

Equivalence of models A and B: Two configuration models have not diverged if and only if their symbolic encodings $\varphi$ and $\psi$ are equivalent, i.e., if the formula $\varphi \leftrightarrow \psi$ is valid. The system automates this proof step using conventional theorem provers, such as commercial SMT solvers. Note that $\varphi \leftrightarrow \psi$ is equivalently expressed by $\varphi \rightarrow \psi \wedge \psi \rightarrow \varphi$.

The SMT solver searches for a satisfying assignment for the formula, that is, any solution for which the two model formulas are not equivalent. If the SMT solver finds a satisfying assignment $\vec{v}$, it constitutes a product configuration that is valid in one of the underlying configuration models, but not in the other. This is illustrated as the SMT solve for equivalence 222.

Otherwise, the SMT solver returns UNSAT (unsatisfiable); hence, no configuration exists that demonstrates a difference between the two models. As the search performed by the SMT solver is exhaustive, the absence of such a witness proves the equivalence of the two input models.

Some configurations that are valid in model A are invalid in model B: This process checks the satisfiability of the formula $\varphi \wedge \neg \psi$. If an SMT solve process finds a satisfying assignment for that formula, it corresponds to a configuration of model A, but that is not valid in model B. This is illustrated as configurations valid in one model but invalid in other 232.

With this piece of information it is possible to find out why there is a discrepancy between models A and B. To do so, the system sets cex to denote the satisfying assignment obtained by checking satisfiability of $\varphi \wedge \neg \psi$. As $\psi$ corresponds to the first-order logic encoding of model B, one can decompose $\psi$ as an equivalent conjunction of model constraints, each of which is labeled by an activation $lit_i$.

The system thereby obtains the formula $\Psi = \wedge_{\{i=1\}}^{k} lit_i \rightarrow \psi_i$. Using this formulation, the SMT solver detects the reason for the loss of product cex in model B. The satisfiability query for the formula cex$\wedge \Psi$ under the activation literals $lit_i, \ldots, lit_k$ is negative by construction, i.e., the formula is unsatisfiable. Extracting the unsatisfiable core of the activation literals $lit_i, \ldots, lit_k$ then represents those constraints in model B which are responsible for the loss of the product that has formally been described by the assignment cex. By iteratively looking at each variant of $\varphi$ that is not part of the solution space of $\psi$ it is possible to find all discrepancies between the two models.

Repeating this process using the second sub-formula of initial formula $\varphi \rightarrow \psi \wedge \psi \rightarrow \varphi$ allows the system to determine if there are problems the other way around, too, by iteratively looking at each variant of w that is not part of the solution space of $\varphi$.

The following is exemplary pseudo code for a process performed by a system as disclosed herein:
  $\varphi$=model (a)
  $\psi$=model (b)
  $\varphi \leftrightarrow \psi$; is $\varphi$ equivalent to $\psi$?
  $\varphi \rightarrow \psi \wedge \psi \rightarrow \varphi$; reformulation of $\varphi \leftrightarrow \psi$
  for $(\alpha \rightarrow \beta)$ in $(\varphi \rightarrow \psi, \psi \rightarrow \varphi)$ do; for each configuration in the model
    if (compute$\neg (\alpha \rightarrow \beta)$)=SAT; check for satisfiability (nonequivalence)
    let $\gamma$=variant $(\neg (\alpha \rightarrow \beta))$; let $\gamma$ be a variant in $\alpha$ but not in $\beta$
    let $\delta$=unsatcore(compute $(\gamma \wedge \beta)$); let $\beta$ be the problematic constraints in $\beta$
    . . . ; balance the models
    else all variants in $\alpha$ can be derived from $\beta$
    continue FIG. 3 depicts a flowchart of a process in accordance with disclosed embodiments that may be performed, for example, by a PLM or PDM system, referred to generically as the "system" below.

The system receives a first configuration model and a second configuration model (305). These configuration models are to be verified for equivalence, and can be product configuration models representing a physical product including a plurality of variants. If they are different, differences can be identified. "Receiving," as used herein, can include loading from storage, receiving from another device or process, receiving via an interaction with a user, and otherwise.

The system generates a first order logic (FOL) representation of the first configuration model and an FOL representation of a corresponding second configuration model (310). Note that while this exemplary process is drawn to checking a single configuration of each model, the process can and typically will be performed for multiple or all configurations in the models. "Corresponding," in this context, refers to configurations in respective models that represent product configurations that should be identical.

The system performs an SMT solve for satisfiability on the FOL representation of the first c and the FOL representation of the second configuration model (315), which can be performed using an SMT solver. In specific embodiments, the system attempts to satisfy a proposition that the first configuration and the second configuration are not identical ("nonequivalence satisfiability"). Of course, those of skill in the art recognize that the opposite proposition could be tested.

If the SMT solve for satisfiability is not satisfied (UNSAT), then the first configuration is identical to the second configuration and the system stores or reports an indication of the equivalence (335).

If the SMT solve for nonequivalence satisfiability is satisfied (SAT), then the first configuration is different from the second configuration. The system can store or report an indication of the non-equivalence. The system performs an SMT solve for variants in the first configuration that are not present in the second configuration (320).

The system performs an SMT solve for variants in the second configuration that are not present in the first configuration (325).

The system stores the identified variants in the first configuration model that are not present in the second configuration model and the identified variants in the second configuration model that are not present in the first configuration model (the discrepancies) (330).

One significant advantage processes as described herein is the direct comparability of hierarchical data models stemming from different meta-models or, of course, the same meta-model. Using techniques as disclosed herein, it is possible to prove the equality of, for example, migrated data of two different engineering tools or different versions of the same engineering tool. This saves costly trial-and-error migration comparison, or, even worse, detecting data model inconsistencies in late production stages.

On significant technical feature contributing to the comparability of different data models is the translation of each data model into first-order logic. First-order logic enables the system to build equations used to prove equality, inequality and show counter-examples when equality is not given. The use of satisfiability modulo theories solvers enable the quick computation of these equations.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements to the specific examples disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke a "means plus function" interpretation unless the exact words "means for" are followed by a participle.

What is claimed is:

1. A method performed by a data processing system, comprising:
   determining whether configuration models of two different engineering tools or different versions of a configuration model of a same engineering tool are equivalent, including by:
   receiving a first configuration model and a second configuration model, wherein the first configuration model and the second configuration model each model constraints for physical characteristics of a product;
   generating a first order logic (FOL) representation of the first configuration model and an FOL representation of the second configuration model;
   performing a satisfiability modulo theories (SMT) solve for nonequivalence satisfiability on the FOL representation of the first configuration model and the FOL representation of the second configuration model; and
   when the SMT solve for satisfiability is not satisfied, storing an indication that the first configuration model is equivalent to the second configuration model.

2. The method of claim 1, wherein when the SMT solve for nonequivalence satisfiability is satisfied, storing an indication that the first configuration model is not equivalent to the second configuration model.

3. The method of claim 1, wherein when the SMT solve for nonequivalence satisfiability is satisfied, performing an SMT solve for variants in the first configuration model that are not present in the second configuration model, and storing variants identified by the SMT solve for variants in the first configuration model that are not present in the second configuration model.

4. The method of claim 1, wherein $\vec{v}=(v_1, v_2, \ldots, v_n)$ is used to denote a vector of configuration options that uniquely determine the first configuration model.

5. The method of claim 1, wherein $\varphi$ represents the FOL representation of the first configuration model,
   $\psi$ represents the FOL representation of the second configuration model, and
   performing a satisfiability modulo theories (SMT) solve for nonequivalence satisfiability comprises searching for a satisfying assignment for $\neg(\varphi \rightarrow \psi)$ or $\neg(\psi \rightarrow \varphi)$.

6. The method of claim 1, wherein $\varphi$ represents the FOL representation of the first configuration model,
   $\psi$ represents the FOL representation of the second configuration model, and
   performing an SMT solve for variants comprises checking the satisfiability of $\varphi \wedge \neg \psi$ and $\psi \wedge \neg \varphi$.

7. A data processing system having at least a processor and an accessible memory,
   the data processing system configured to determine whether configuration models of two different engineering tools or different versions of a configuration model of a same engineering tool are equivalent, including by:
   receiving a first configuration model and a second configuration model, wherein the first configuration model and the second configuration model each model constraints for physical characteristics of a product;
   generating a first order logic representation of the first configuration model and an FOL representation of the second configuration model;
   performing a satisfiability modulo theories (SMT) solve for nonequivalence satisfiability on the FOL representation of the first configuration model and the FOL representation of the second configuration model; and
   when the SMT solve for satisfiability is not satisfied, storing an indication that the first configuration model is equivalent to the second configuration model.

8. The data processing system of claim 7, wherein the data processing system is further configured to, when the SMT solve for nonequivalence satisfiability is satisfied, store an indication that the first configuration model is not equivalent to the second configuration model.

9. The data processing system of claim 7, wherein the data processing system is further configured to, when the SMT solve for nonequivalence satisfiability is satisfied, perform an SMT solve for variants in the first configuration model that are not present in the second configuration model, and store variants identified by the SMT solve for variants in the first configuration model that are not present in the second configuration model.

10. The data processing system of claim 7, wherein $\vec{v}=(v_1, v_2, \ldots, v_n)$ is used to denote a vector of configuration options that uniquely determine the first configuration model.

11. The data processing system of claim 7, wherein $\varphi$ represents the FOL representation of the first configuration model, $\psi$ represents the FOL representation of the second configuration model, and performing a satisfiability modulo theories solve for nonequivalence satisfiability comprises searching for a satisfying assignment for $\neg(\varphi \rightarrow \psi)$ or $\neg(\psi \rightarrow \varphi)$.

12. The data processing system of claim 7, wherein $\varphi$ represents the FOL representation of the first configuration model, $\psi$ represents the FOL representation of the second configuration model, and performing an SMT solve for variants comprises checking the satisfiability of $\varphi \wedge \neg \psi$ and $\psi \wedge \neg \varphi$.

13. A non-transitory machine-readable medium encoded with executable instructions that, when executed, cause a data processing system to determine whether configuration models of two different engineering tools or different versions of a configuration model of a same engineering tool are equivalent, including by:

receiving a first configuration model and a second configuration model, wherein the first configuration model and the second configuration model each model constraints for physical characteristics of a product;

generating a first order logic representation of the first configuration model and an FOL representation of the second configuration model;

performing a satisfiability modulo theories (SMT) solve for nonequivalence satisfiability on the FOL representation of the first configuration model and the FOL representation of the second configuration model; and when the SMT solve for satisfiability is not satisfied, storing an indication that the first configuration model is equivalent to the second configuration model.

14. The non-transitory machine-readable medium of claim 13, further encoded with executable instructions to, when the SMT solve for nonequivalence satisfiability is satisfied, store an indication that the first configuration model is not equivalent to the second configuration model.

15. The non-transitory machine-readable medium of claim 13, further encoded with executable instructions to, when the SMT solve for nonequivalence satisfiability is satisfied, perform an SMT solve for variants in the first configuration model that are not present in the second configuration model, and store variants identified by the SMT solve for variants in the first configuration model that are not present in the second configuration model.

16. The non-transitory machine-readable medium of claim 13, wherein $\vec{v}=(v_1, v_2, \ldots, v_n)$ is used to denote a vector of configuration options that uniquely determine the first configuration model.

17. The non-transitory machine-readable medium of claim 13, wherein $\varphi$ represents the FOL representation of the first configuration model, $\psi$ represents the FOL representation of the second configuration model, and performing a satisfiability modulo theories solve for nonequivalence satisfiability comprises searching for a satisfying assignment for $\neg(\varphi \rightarrow \psi)$ or $\neg(\psi \rightarrow \varphi)$.

18. The non-transitory machine-readable medium of claim 13, wherein $\varphi$ represents the FOL representation of the first configuration model, $\psi$ represents the FOL representation of the second configuration model, and performing an SMT solve for variants comprises checking the satisfiability of $\varphi \wedge \neg \psi$ and $\psi \wedge \neg \varphi$.

* * * * *